(12) United States Patent
Lotfi et al.

(10) Patent No.: US 11,195,674 B2
(45) Date of Patent: Dec. 7, 2021

(54) RADIATION-HARDENED BREAK BEFORE MAKE CIRCUIT

(71) Applicant: COBHAM COLORADO SPRINGS INC., Colorado Springs, CO (US)

(72) Inventors: Younes J. Lotfi, Colorado Springs, CO (US); Thomas R. Richardson, Lakewood, CA (US); James E. Colley, Albany, OR (US)

(73) Assignee: Cobham Colorado Springs Inc., Colorado Springs, CO (US)

( * ) Notice: Subject to any disclaimer, the term of this patent is extended or adjusted under 35 U.S.C. 154(b) by 340 days.

(21) Appl. No.: 16/126,773

(22) Filed: Sep. 10, 2018

(65) Prior Publication Data

US 2019/0006134 A1 Jan. 3, 2019

Related U.S. Application Data

(63) Continuation of application No. 15/357,434, filed on Nov. 21, 2016, now Pat. No. 10,074,493.

(51) Int. Cl.
*H01H 9/54* (2006.01)
*H03K 19/003* (2006.01)

(52) U.S. Cl.
CPC ........... *H01H 9/54* (2013.01); *H03K 19/0033* (2013.01)

(58) Field of Classification Search
CPC .............................. H01H 9/54; H03K 19/0033
See application file for complete search history.

(56) References Cited

U.S. PATENT DOCUMENTS

| | | | | |
|---|---|---|---|---|
| 4,701,889 A | * | 10/1987 | Ando | G11C 7/1051 365/189.05 |
| 4,843,261 A | * | 6/1989 | Chappell | G11C 8/10 326/108 |
| 5,008,858 A | * | 4/1991 | Ikeda | G11C 8/10 365/124 |
| 5,062,082 A | * | 10/1991 | Choi | G11C 8/18 365/230.06 |
| 5,306,963 A | * | 4/1994 | Leak | H03K 5/1534 326/93 |
| 5,493,538 A | * | 2/1996 | Bergman | G11C 8/18 327/26 |
| 5,729,492 A | * | 3/1998 | Campardo | G11C 16/28 365/185.13 |
| 6,016,284 A | * | 1/2000 | Itagaki | G11C 8/18 365/233.5 |
| 6,181,635 B1 | * | 1/2001 | Bae | G11C 8/10 365/230.06 |
| 6,448,838 B1 | | 9/2002 | Heim et al. | |
| 7,265,591 B1 | | 9/2007 | Petrofsky | |
| 2002/0196674 A1 | * | 12/2002 | Kamiyama | G11C 8/10 365/194 |

(Continued)

*Primary Examiner* — Pinping Sun
(74) *Attorney, Agent, or Firm* — Morgan, Lewis & Bockius LLP

(57) ABSTRACT

A break-before-make (BB4M) circuit topology is disclosed for use with a multiplexer that eliminates shoot-through current between analog inputs and also between an analog input and analog output. The BB4M circuit generates a pulse that disables an existing selected channel before enabling a newly selected channel or gate driver, and is suitable for use in high-radiation or outer space operating environments.

18 Claims, 16 Drawing Sheets

(56) References Cited

U.S. PATENT DOCUMENTS

| | | | |
|---|---|---|---|
| 2004/0240303 A1* | 12/2004 | Kim | G11C 11/4087 |
| | | | 365/230.06 |
| 2005/0122148 A1* | 6/2005 | Park | G11C 7/222 |
| | | | 327/172 |
| 2005/0179469 A1* | 8/2005 | Kasanyal | H04L 25/0286 |
| | | | 327/65 |
| 2009/0190410 A1 | 7/2009 | Faue | |
| 2009/0310978 A1* | 12/2009 | Uemura | H04B 10/801 |
| | | | 398/195 |
| 2011/0018602 A1* | 1/2011 | Ali | H03K 5/1534 |
| | | | 327/230 |
| 2014/0333272 A1 | 11/2014 | D'Angelo | |
| 2017/0040990 A1 | 2/2017 | Anand et al. | |
| 2017/0063373 A1 | 3/2017 | Suarez | |
| 2017/0279451 A1* | 9/2017 | Satou | H03K 19/17728 |

* cited by examiner

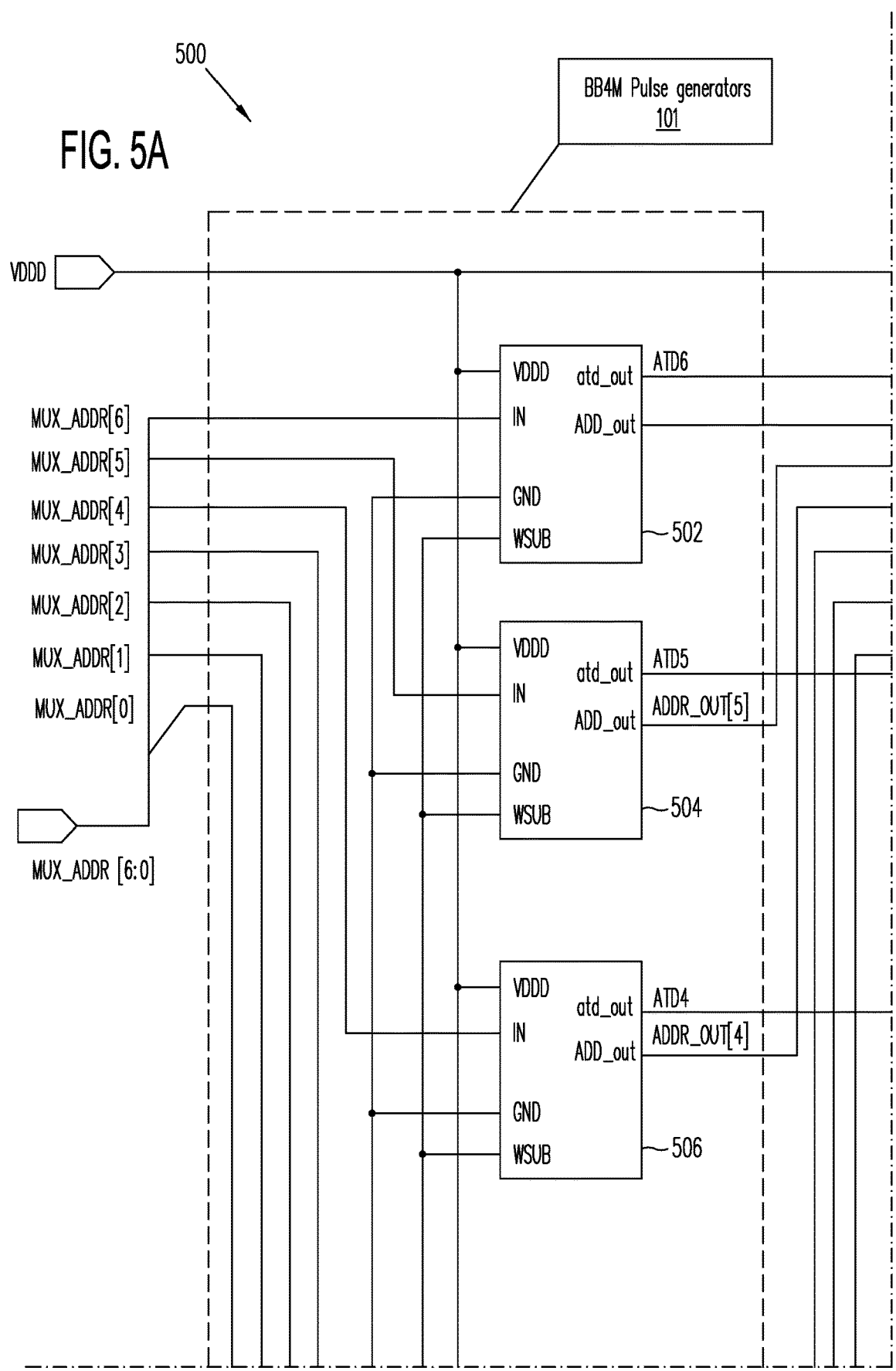

RADIATION-HARDENED BREAK BEFORE MAKE CIRCUIT

CROSS REFERENCE TO RELATED APPLICATIONS

This application is a continuation of U.S. patent application Ser. No. 15/357,434, filed Nov. 21, 2016, titled "RADIATION-HARDENED BREAK BEFORE MAKE CIRCUIT," which is now U.S. Pat. No. 10,074,493, issued on Sep. 11, 2018, the full disclosure is hereby incorporated by reference in its entirety for all purposes.

BACKGROUND OF THE INVENTION

1. Field of the Invention

The present invention relates to "Break-Before-Make" ("BB4M") switching circuits. More particularly, an embodiment of the present invention relates to radiation-hardened BB4M switching circuits that are particularly well suited for use in outer space operating environments.

2. Background Description

Transient and radiation induced current and voltage glitches in integrated circuits can cause functionality errors if the radiation induced voltage glitch does not get attenuated or filtered out. Voltage glitches with sufficient amplitude and pulse duration would alter the voltage potential levels at the output of the circuit causing functional errors.

While BB4M switching circuits are known in the art and can be used to mitigate the glitches referred to above, as well as other functionality errors, not all of these circuits are appropriate for use in a high-radiation environment. Prior art BB4M switching circuits including storage elements such as latches, flip flops or other forms of cross-coupled circuits that are generally more susceptible to transient and radiation effect known as single event upset ("SEU").

What is needed, therefore, is a BB4M switching circuit that is suitable for use in a high-radiation operating environment such as an outer space operating environment.

SUMMARY OF THE INVENTION

According to an embodiment of the present invention, a circuit is disclosed that is a new break-before-make (BB4M) circuit topology for use with at least a multiplexer that eliminates shoot-through current between analog inputs and also between an analog input and analog output. The BB4M circuit according to the present invention generates a pulse that disables the existing selected channel before enabling newly selected channel or gate driver.

The BB4M circuit according to the present invention eliminates usage of storage elements such as latches, flip flops or other forms of cross coupled circuits that are generally more susceptible to transient and radiation effect known as single event upset ("SEU"). The break-before-make circuit according to the present invention uses digital logic gates and buffers with delay elements such as resistor and capacitors.

Some of the commonly used applications of break-before make circuit include analog and digital multiplexers, input and output drivers. The BB4M circuit of the present invention can be implemented in digital and analog integrated circuits ("IC"). The disclosed circuit according to the present invention can also be implemented with discrete devices in printed circuit boards ("PCB") if desired. The break-before-make circuit according to the present invention, when used in conjunction with multiplexers disables the existing selected channel before enabling the new selected channel. This prevents selection of two or multiple channels simultaneously and thus prevent short among voltage sources present at channel inputs and thus reducing the shoot through current.

Some of the integrated circuit (IC) designs such as multiplexers require a BB4M to control the selection of a new input. The circuit (break-before-make) according to the present invention prevents the shoot through currents in inputs, output drivers, and power supplies as well as cross talk and current flow between the input sources. These are achieved by a BB4M circuit according to the present invention that prevents two channels being selected simultaneously. Shoot through current is prevented by ensuring that only one channel is selected at a given time.

BRIEF DESCRIPTION OF THE DRAWINGS

FIGS. 5A-5F show a schematic of a break-before-make circuit implementation with seven address/select inputs according to an embodiment of the present invention;

DETAILED DESCRIPTION OF THE PREFERRED EMBODIMENTS

Figure 1:
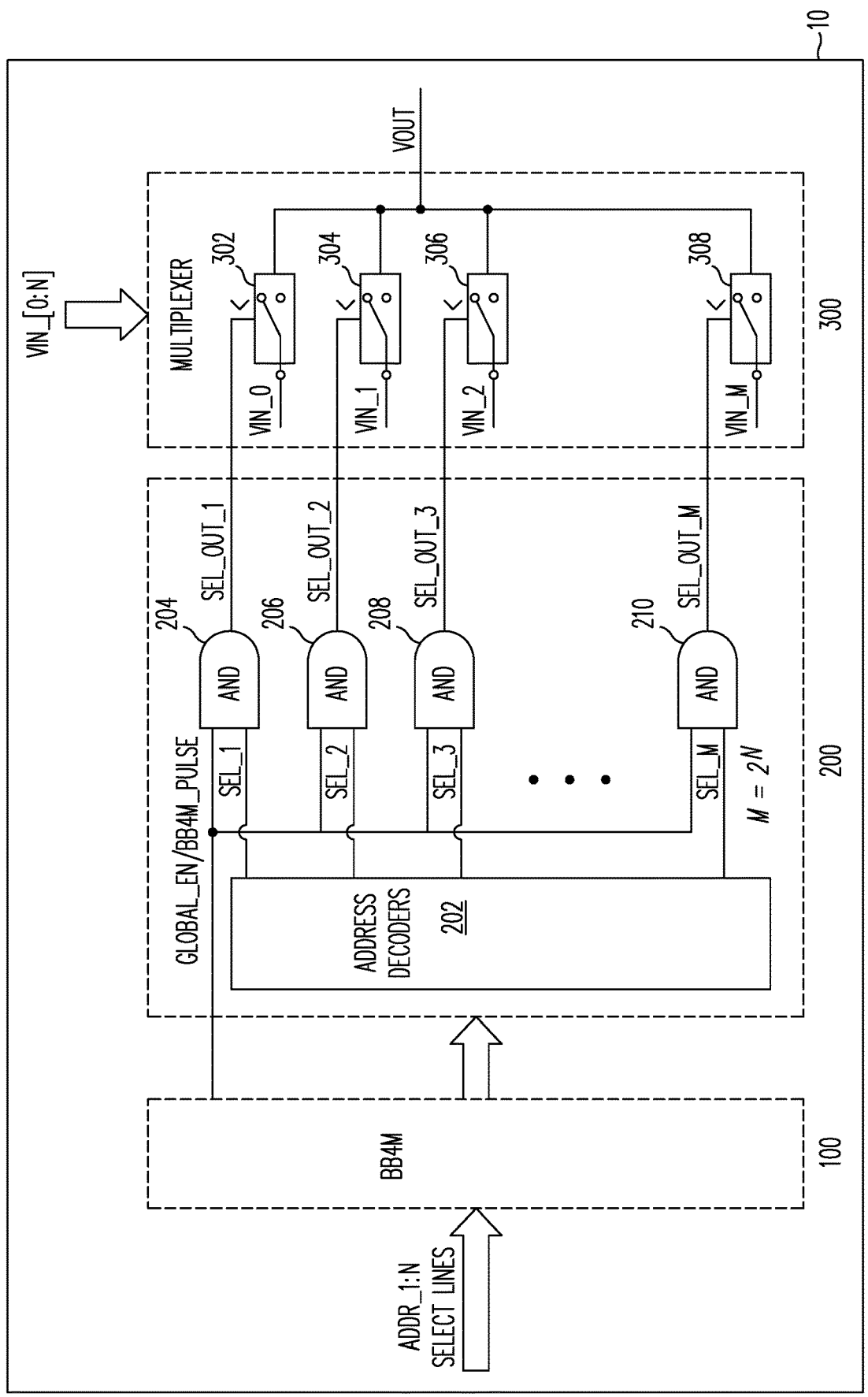
FIG. 1 shows a block diagram of analog multiplexer with a BB4M switching circuit according to an embodiment of the present invention.

Referring now to FIG. 1, a block diagram 10 of a BB4M circuit according to the present invention includes a BB4M pulse generator 100, a decoder circuit 200, and an analog multiplexer 300. While the BB4M circuit according to the present invention is shown operating on an analog multiplexer, other such analog or digital circuits could be used. Break before make block 100 generates a pulse when detecting a transition in any of the address inputs, and is shown in further detail in FIG. 2. Decoder block 200 of FIG. 1 includes address decoders 202, which can be of conventional design. The output of the address decoder 202 (signals SEL_1, SEL_2, SEL_3, through SEL_M) is combined with the global enable pulse (GLOBAL_EN) provided by BB4M pulse generator 100 through the operation of AND gates 204, 206, 208, through 210 to provide select signals SEL_OUT_1, SEL_OUT_2, SEL_OUT_3, through SEL_OUT_M. The select signals are used to operate the individual multiplexer switches 302, 304, 306, through 308. Thus multiplexer 300 is used to selectively couple the analog voltage inputs VIN_0, VIN_1, VIN_2, through VIN_M to the analog voltage output VOUT.

Figure 2:
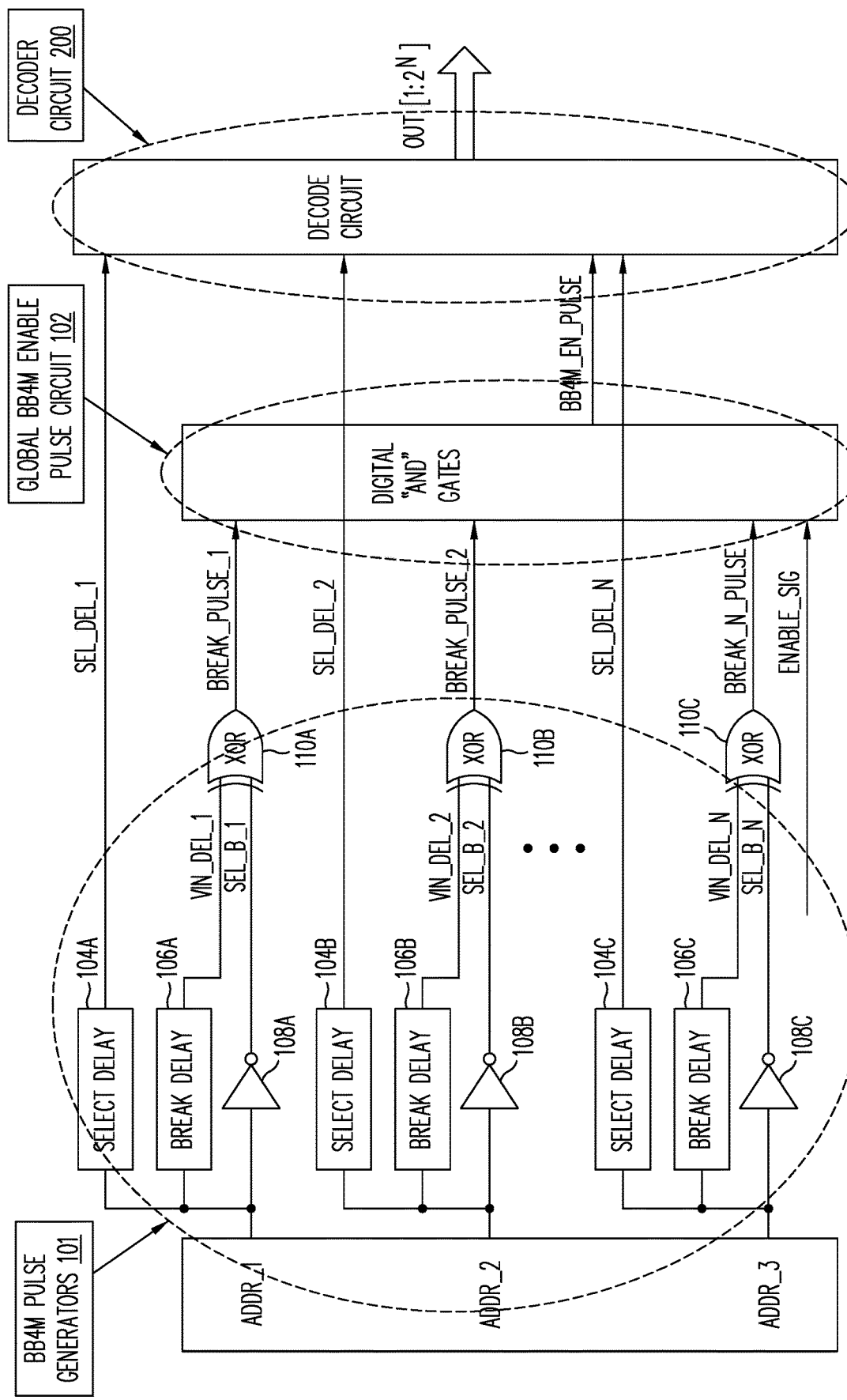
FIG. 2 shows a simplified block diagram of the break-before-make circuit and decode block according to an embodiment of the present invention.

FIG. 2 shows the simplified implementation block diagram of break-before-make BB4M pulse generators 101, global BB4M enable pulse circuit 102 (circuits 101 and 102 are both within circuit 100 shown in FIG. 1) and decode block 200, which was also shown in FIG. 1. In break-before-make circuit 100 each address/select input signal gets delayed by a select delay block 104A, 104B, through 104C, and becomes input to the decode circuit 200. This delay eliminates any noise/glitch generated by decode block 200 and multiplexer 300 switches due to skew between address inputs. This delay of address ensures none of the address transitions get decoded before the break-before-make pulse starts.

Each address/select input also has its own individual break-before-make pulses. The inverter 108A, break delay 106A and XOR 110A in pulse generator 101 generate the BB4M pulse if there is any transition on address/select input (low to high or high to low) ADDR_1. The delay of the BREAK DELAY circuit 106A is much larger than the delay of inverter 108A. The pulse width of BB4M is set by the delay time of BREAK DELAY. The output of the XOR gate 110A is shown as BREAK_PULSE_1, and the output of the select delay circuit 104A is shown as SEL_DEL_1 in FIG. 2. Similar circuits are shown for each of the addresses ADDR_1, ADDR_2 and ADDR_3 shown in FIG. 2. For example, select delay circuit 104B, break delay circuit 106B, inverter 108B, and XOR gate 110B are associated with address ADDR_2. Similarly, select delay circuit 104C, break delay circuit 106C, inverter 108C, and XOR gate 110C are associated with address ADDR_3.

Individual BB4M pulses BREAK_PULSE_1, BREAK_PULSE_2, and BREAK_PULSE_N get combined through AND gates 102 and generates the global BB4M enable pulse (BB4M_EN_PULSE). This BB4M pulse and delayed address signals become input to the decoder circuit 200. The actual gates of the AND function blocks in FIG. 2 are shown in greater detail in FIG. 5. In the present invention, a logical AND function is completed in three stages. The first two stages of AND gates combine individual break pulses associated with each address/select into a single break pulse. The final AND gate combines the global break pulse with enable/control signals. The final global break pulse polarity is inverted. The purpose of the select delay is to ensure that when any address makes a transition the new address/select line or lines do not get decoded before the break pulse becomes enabled. Select delay is much shorter in comparison to the break delay. The break delay sets the required pulse width for a single shot pulse. When an address/select line makes a transition a single shot pulse is enabled and remains valid for the duration of time set by resistors and capacitors in break delay. For example, if ADDR1 makes a transition from low to high or from high to low Break delay (106A), inverter (108A), and XOR (110A) generates a single shot pulse. The falling edge of this pulse (output of XOR) will set the beginning of the pulse in block 101. The output of the XOR gate will transition from low to high after the delay through break delay. This will end the single shot pulse. The width of this single shot pulse is the break pulse time. For the duration of this pulse all the decoders will be turned off.

The global enable pulse from break-before-make circuit 100 and the output of address decode circuit 200 become the input to the final multiplexer block 300.

Select lines from the output of the address decode block 200 are combined with output of break-before-make block to select the new switch or channel in the multiplexer block 300. At the beginning of the BB4M pulse the existing switch or channel becomes disabled. At the end of the BB4M pulse (when BB4M pulse expires/ends) a new switch or channel is enabled. Decode circuit 200 receives the SEL_DEL_1 through SEL_DEL_N select signals and the BREAK_PULSE_1 through BREAK_PULSE_N signals to generate the OUT [1:2^N], wherein "N" is the number of address/select lines. The decoder block is necessary in circuits such as analog or digital multiplexer to decode a given address/select combination to select a channel (input voltage to be connected to a single output) whether a break before make function is utilized or not. Decoders can be conventional single stage or multi-stage decoders. A decoder circuit simply allows a new channel (based on new address/select combination) be selected and existing channel (based on previous address/select combination) to be disabled when address/select lines changes from one address/select combination to another. Based on address/select combinations, the decoder outputs determine which of the 2^N input voltages need to be connected to the output.

The method and circuit of the present invention is used to generate a break before time function without using memory elements such as latches or flip flops that are susceptible to radiation environments.

Figure 3:
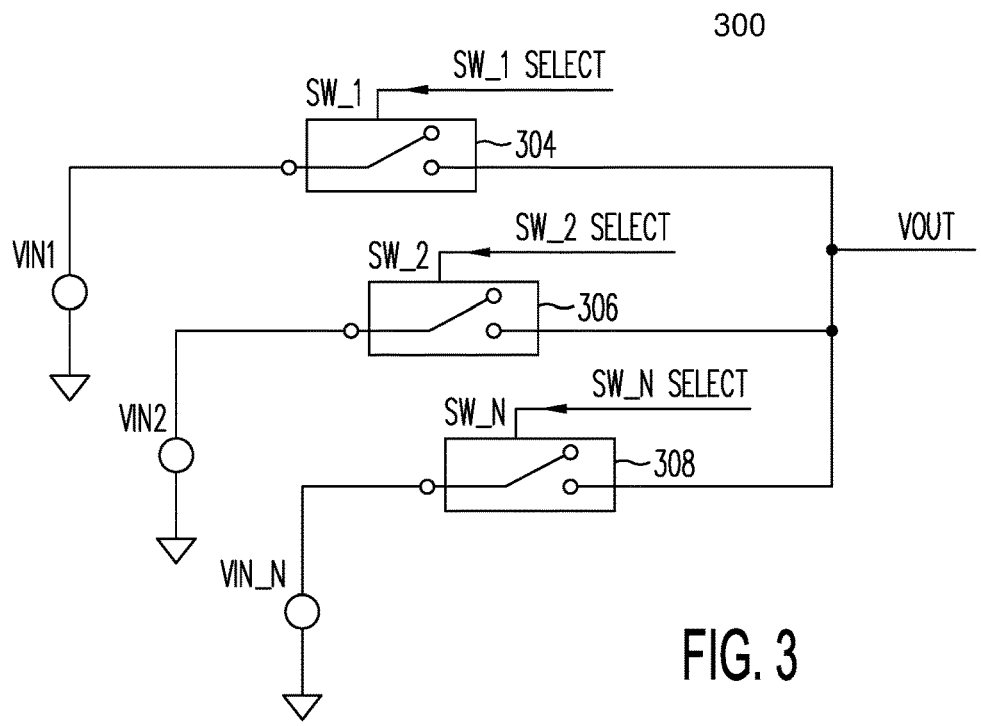
FIG. 3 shows a simplified block diagram of a multiplexer that can be used with the BB4M circuit according to the present invention.

FIG. 3 shows a general block diagram of the analog multiplexer block 300. This block would select the decoded channel by closing the switch and connecting selected input voltage to output (VOUT). Depicted in FIG. 3 is switch SW_1 304 for receiving the SW_1 SELECT signal. When energized, switch 304 couples the analog voltage VIN1 to the analog output voltage VOUT. Also depicted in FIG. 3 is SW_2 306 for receiving the SW_2 SELECT signal. When energized, switch 306 couples the analog voltage VIN2 to the analog output voltage VOUT. Finally depicted in FIG. 3 is SW_N 308 for receiving the SW_N SELECT signal. When energized, switch 308 couples the analog voltage VIN_N to the analog output voltage VOUT. Any number of channels can be used in analog multiplexer 300.

The break-before-make circuit according to the present invention prevents shorting between input voltages when switching from one switch/channel to another. This also prevents two inputs being connected to VOUT during when switching from one channel to another. This is because first existing switch/channel gets disabled at beginning of BB4M_ENABLE pulse and then after some delay set by BB4M_ENABLE pulse the new switch is enabled selected.

Figure 4:
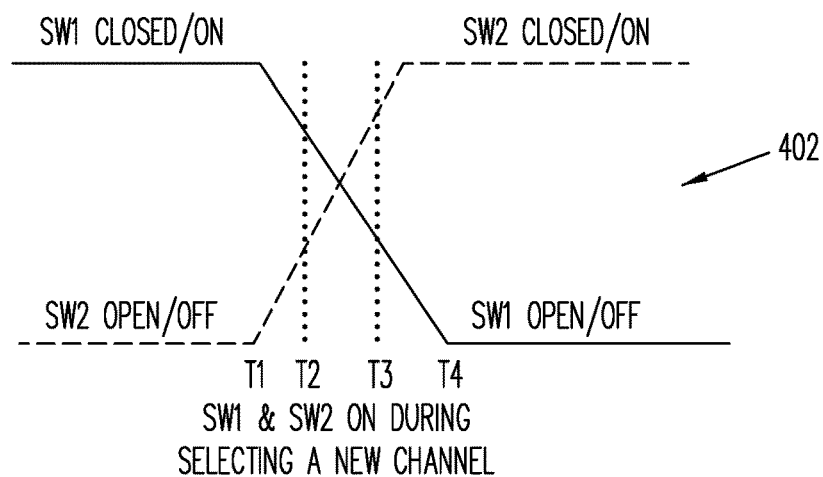
FIG. 4 shows a timing diagram of the state of switches with and without the BB4M pulse according to the present invention.
Figure 4:
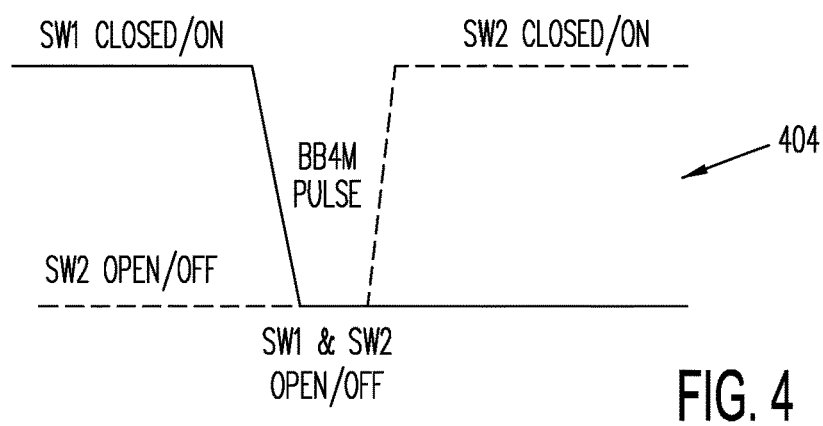
Figure 5B:
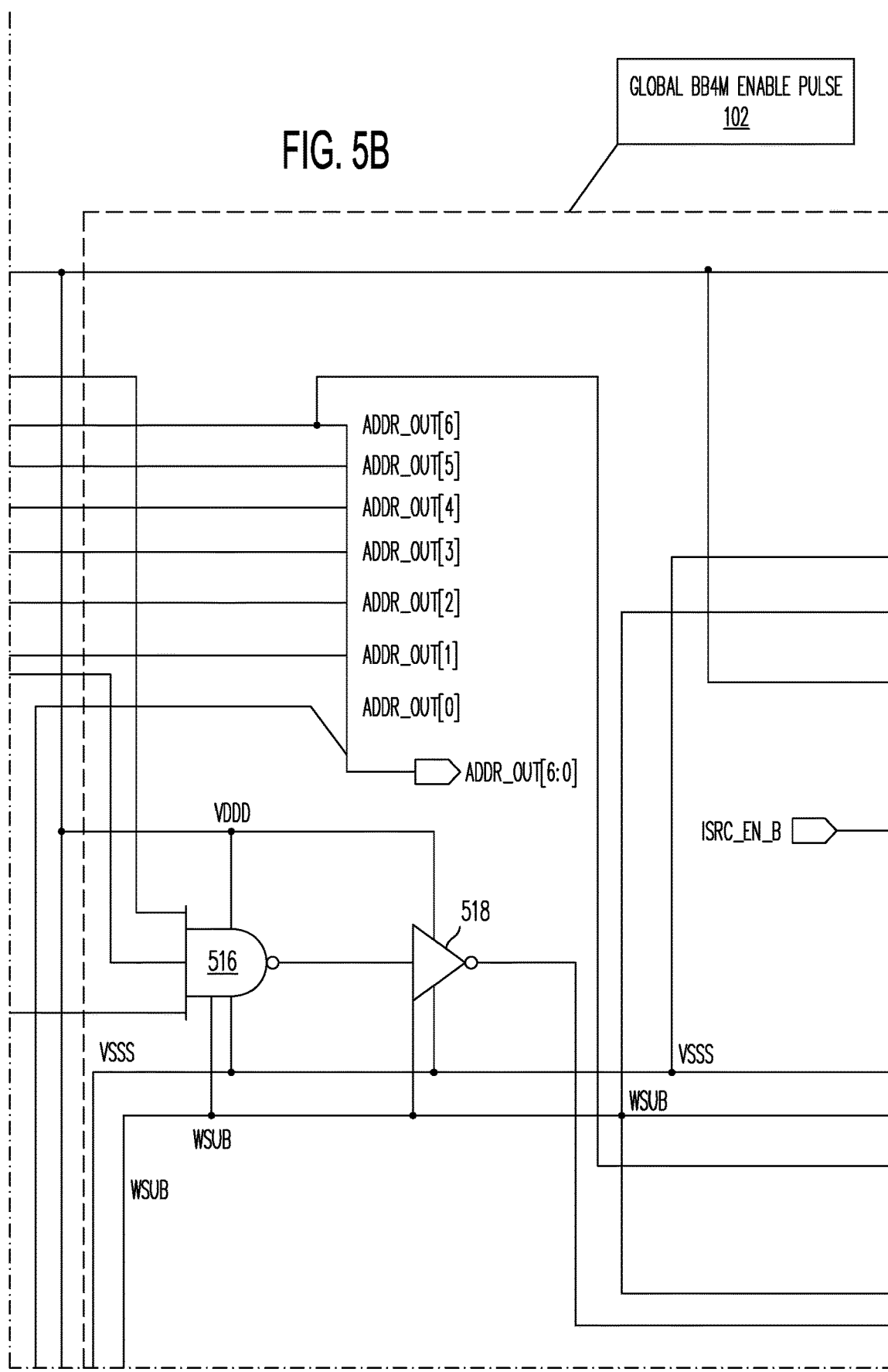
Figure 5C:
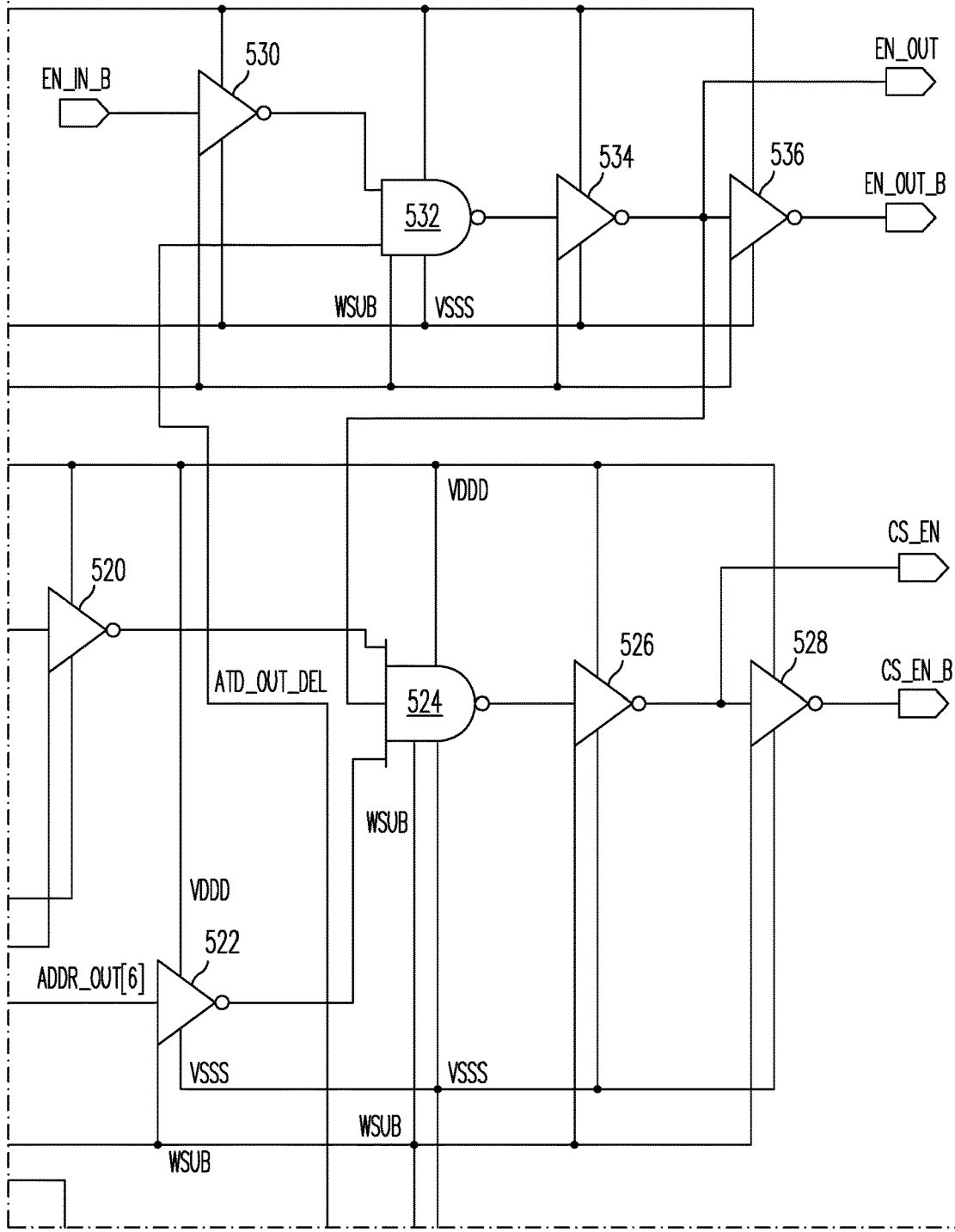
Figure 5D:
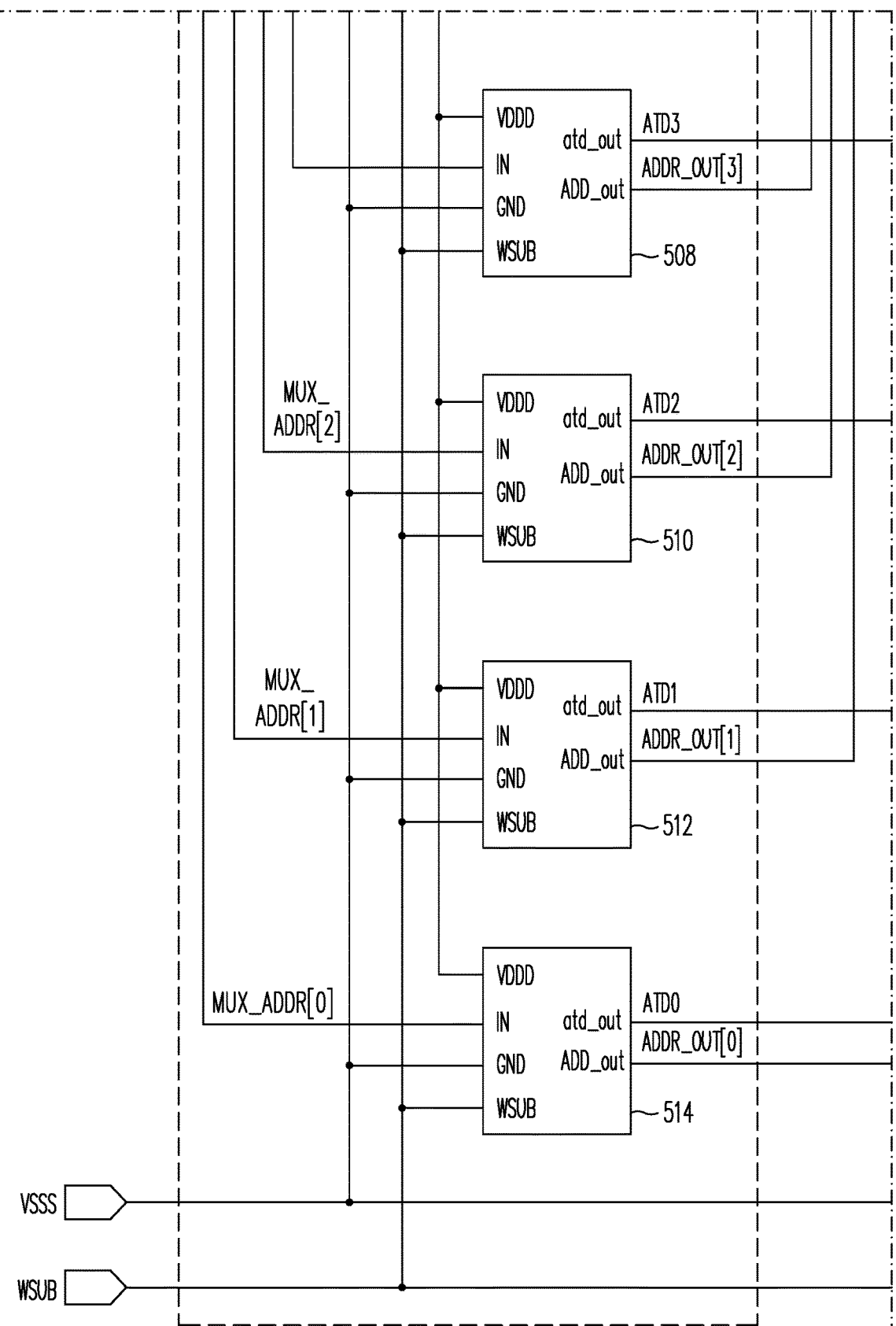
Figure 5E:
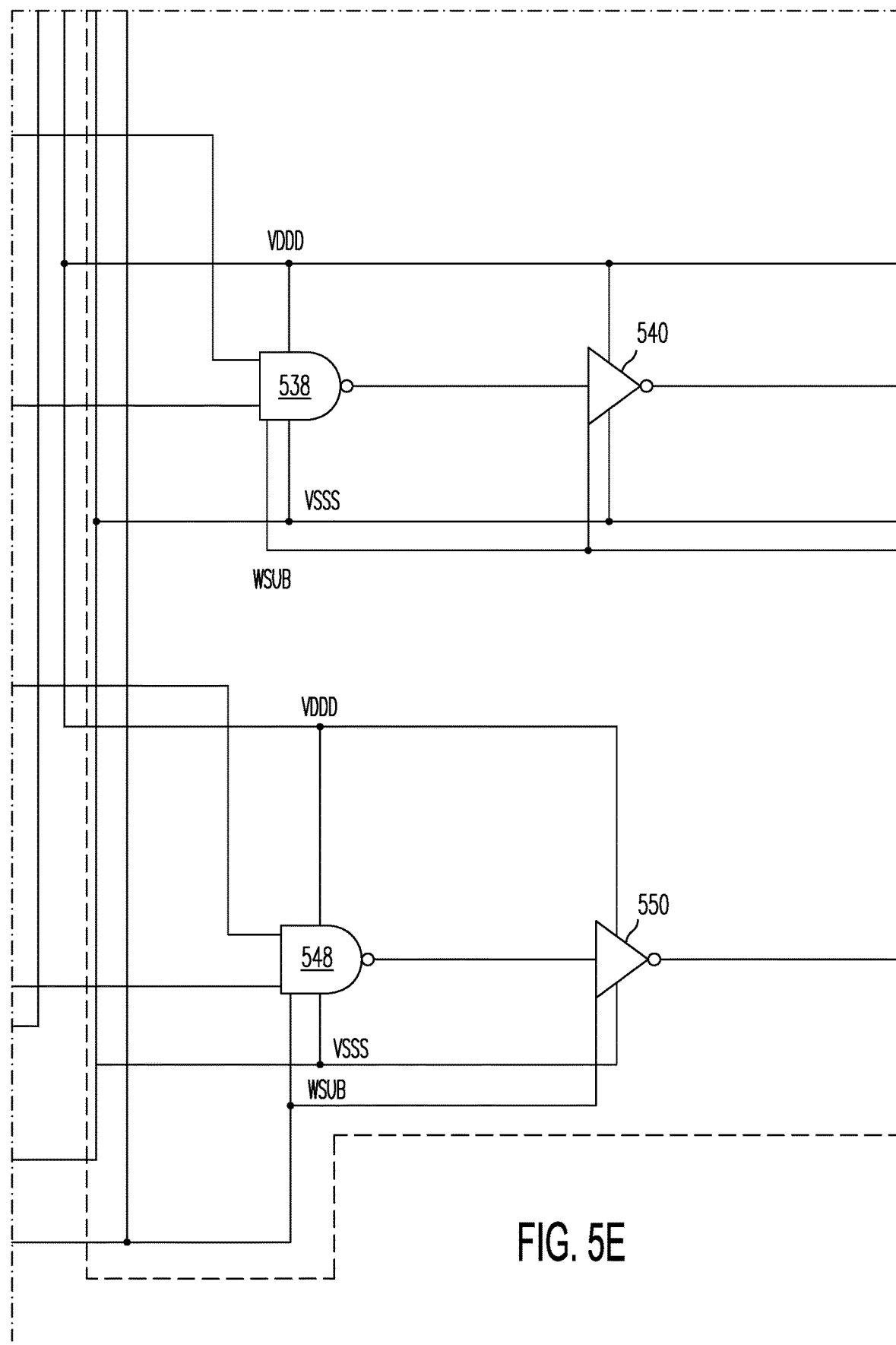
Figure 5F:
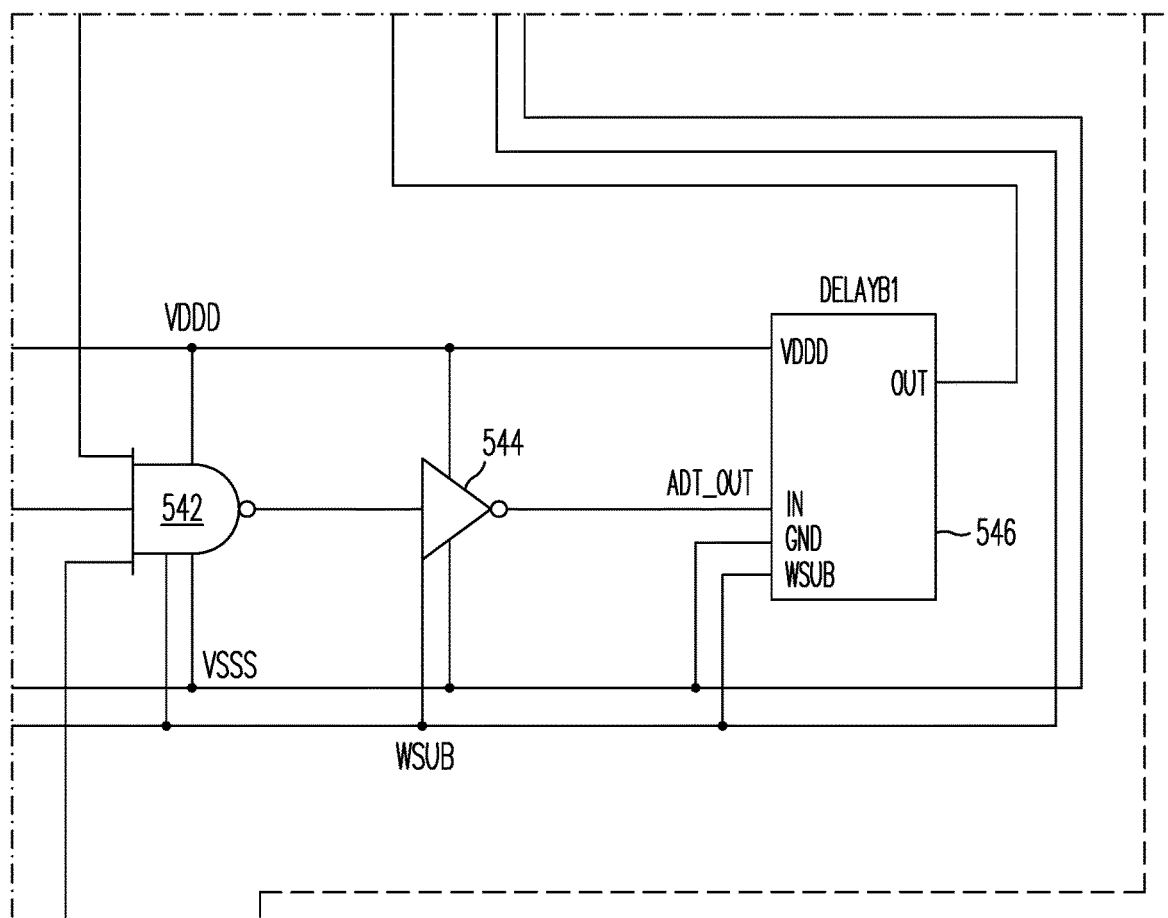

FIG. 4 illustrates the state of two representative switches SW1 and SW2 in an analog multiplexer with and without the break-before-make block according to the present invention. In timing diagram 402 the operating state of switch SW1 transfers from being ON at time T1 to being OFF at time T4. In timing diagram 402 the operating state of switch SW2 transfers from being OFF at time T1 to being ON at time T4. Note that from times T2 to T3 switches SW1 and SW2 can both be on, which can cause circuit errors such as shoot-through currents and voltage, as well as crosstalk and other circuit errors.

The state of the switches SW1 and SW2 is shown in timing diagram 404 using the BB4M circuit according to the present invention. Note that switches SW1 and SW2 are both closed during the duration of the BB4M pulse. The state of SW1 transfers between being closed to being open, and the state of SW2 transfers between being open to closed without any shoot-through current due to the operation of the BB4M pulse delay.

Figure 6:
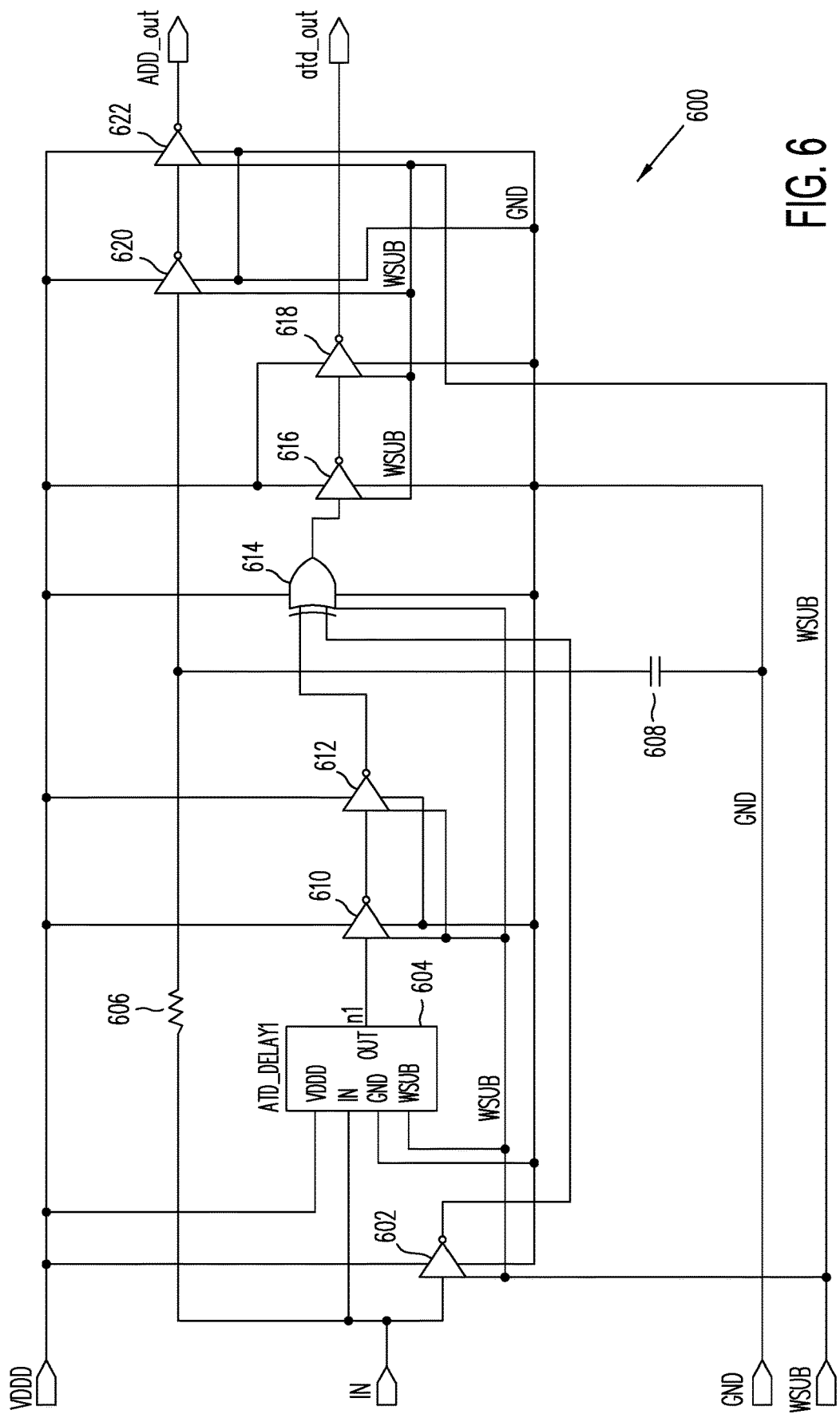
FIG. 6 shows a schematic of the break-before-make pulse generation circuit according to an embodiment of the present invention.
Figure 7:
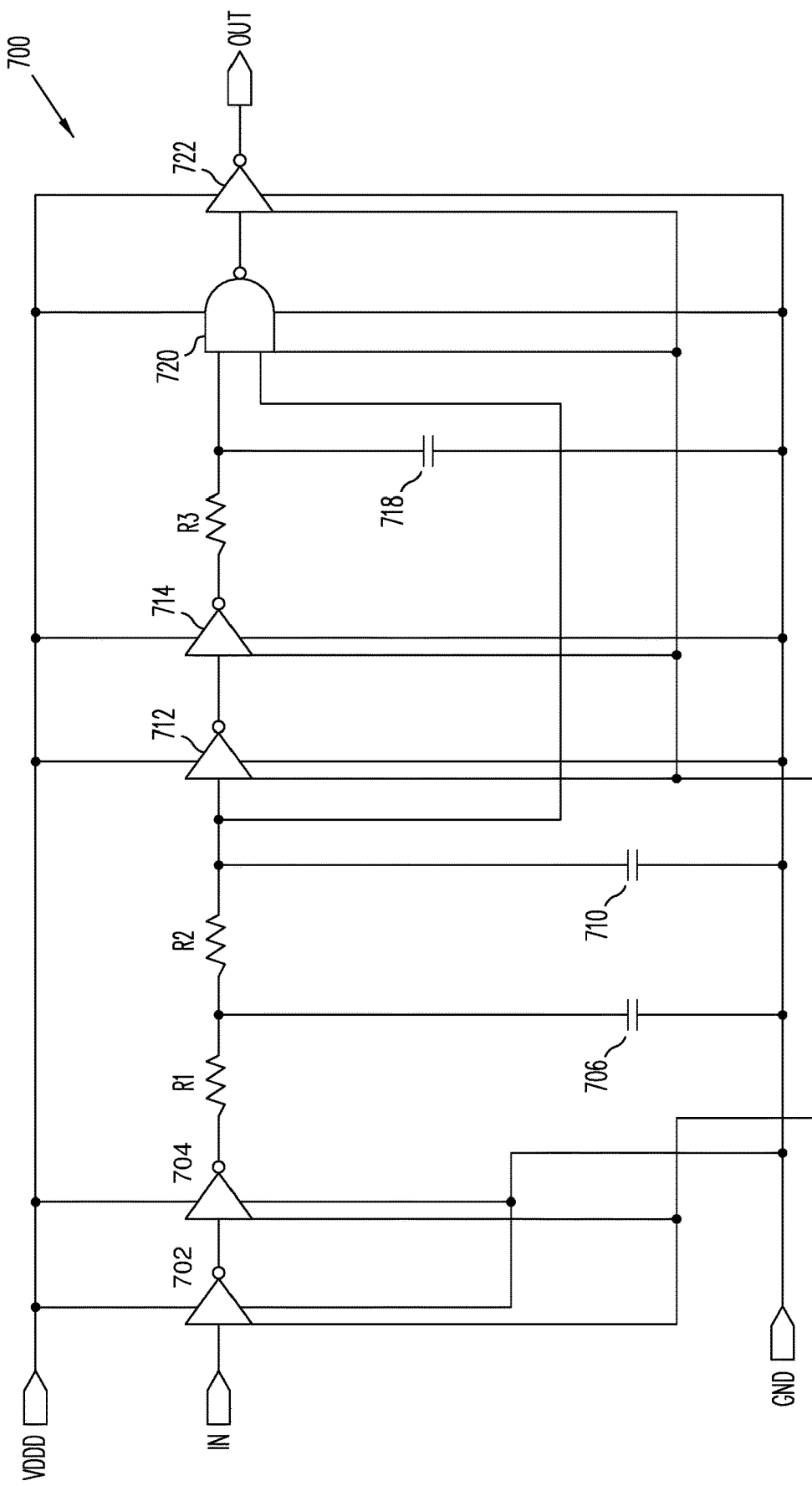
FIG. 7 shows a schematic of a select input break delay circuit according to an embodiment of the present invention.

A general block diagram of a Break-Before-Make (BB4M) circuit in an analog multiplexer implementation has been shown in FIG. 1. The schematic circuit implementation of a BB4M circuit for seven address/select inputs to be fed into decoders for a 128 to 1 multiplexer application is shown in FIGS. 5-7 and described below.

FIGS. 5A-5F show the implementation of a break-before-make pulse circuit 500. This circuit has two sub-blocks. Sub-block 101 has a BB4M pulse generator 502, 504, 506, 508, 510, 512, and 514 for each of its address/select inputs. The schematic diagram for a representative sub-block BB4M pulse generator is shown in greater detail in FIG. 7. The BREAK delay within this BB4M pulse generator is shown in FIG. 7. This delay is set by internal resistor and active NCH_MOSFET device configured as capacitor. Individual BB4M pulses are generated if there is a transition in input from high to low or from low to high. The output of each BB4M is a one shot pulse. The pulse width is determined by the delay in address transition detection circuit. Sub-block 102 combines the individual BB4M pulses into a global enable pulse BB4M_ENABLE.

The BB4M break before make block in FIGS. 5A-5F generates a global break before make pulse that acts as global disable for all the decoders in next stage when address/select inputs make a transition. Break before make pulse blocks for each address/select inputs (502, 504, 506, 508, 510, 512, 514) in block 101 generate a single analog shot pulse if that address/select input makes a transition from low to high or from high to low. Individual break pulses (outputs of 502, 504, 506, 508, 510, 512, 514) then go to the first AND (NAND and INV) gates (516, 518, 538, 540, 548, 550). The output of the first stage AND gates become inputs to the second stage AND gate (542, 544). The output of this second AND gate (544) goes through a delay block (546). A small delay in block 546 is a low pass filter to filter out high transients/glitches. The output of this block (546), and control signals (ISRC_EN_B, and EN_IN_B) feed to inputs of the last AND gates (524, 526, 530, 532). The output of the last stage AND gates is inverted through 536, 528 to generate complimentary break before make pulses for the two decoder paths controlled by ISRC_EN_B, and EN_IN_B and global break before make pulse signal to power down or enable.

Power and substrate connections VDDD, VSSS, and WSUB are also shown in FIGS. 5A-5F. Also shown in FIGS. 5A-5F are inverters 520, 522, 534 and inputs MUX_ADDR[6:0], which includes MUX_ADDR[0] through MUX_ADDR[6]. Also shown in FIGS. 5A-5F are the EN_OUT, EN_OUT_B, CS_EN, CS_EN_B, ATD0, ATD1, ATD2, ATD3, ATD4, ATD5, ATD6, and ATD7 signals.

FIG. 6 shows the circuit that generates the analog single shot pulse upon a transition at the input (IN). This block has two outputs. The output ADD_OUT is the delayed signal with same polarity as the input (IN). This input gets delayed with resistor (606) and MOS capacitor (608) and the output of this RC filter goes through a buffer comprised of two inverters (620, 622). The total delay from IN to ADD_OUT is the select delay shown in simplified block diagram in FIG. 2. Block 604 is the break delay. A single shot pulse is generated at output of XOR (614) and is buffered through two inverters (616, 618) to generate the atd_out output signal. The polarity of inputs to XOR (614) have different polarities with respect to each other. One of the input is inverted through inverter (602) and has opposite polarity with respect to IN. The other input is the delayed signal of IN having same polarity as IN input. When IN input makes a transition from low to high or high to low the inverted signal at input of XOR transitions while the delayed signal from IN remains at its steady state value. This would cause output of XOR to transition low. After a time set by break delay the delayed signal responds to IN transition and causes the output of XOR to transition high ending the break pulse. Table 1 below illustrates the pulse generation sequence described above:

TABLE 1

| Time | IN | Inverted input to XOR | Delayed input to XOR | Output of XOR |
|---|---|---|---|---|
| T0 | Low | High | Low | High |
| T1 | Low to High | High to Low at T1 + TINV delay | Remains Low Since T_brkdelay >> TINV_delay | High to Low within an inverter delay + XOR delay. (Beginning of single shot break pulse) |
| T2 = T1 + T_brkdelay | High | Low | Low to High | Low to High |

A similar event will generate the single shot pulse if the initial state of IN was high and it would make a transition to low state, as set forth in Table 2:

TABLE 2

| Time | IN | Inverted input to XOR | Delayed input to XOR | Output of XOR |
|---|---|---|---|---|
| T0 | High | Low | High | High |
| T1 | High to Low | Low to High at T1 + TINV delay | Remains High Since T_brkdelay >> | High to Low within an inverter delay + XOR |

TABLE 2-continued

| Time | IN | Inverted input to XOR | Delayed input to XOR | Output of XOR |
|---|---|---|---|---|
| | | | TINV_delay | delay. (Beginning of single shot break pulse) |
| T2 = T1 + T_brkdelay | Low | High | High to Low | Low to High (end of single shot break pulse) |

Power and substrate connections VDD, GND, and WSUB are also shown in FIG. 6.

FIG. 7 shows the details for setting the break delay time. This is the single shot pulse width for BB4M. Inverters INV (702, 704, 712, 714) are buffers before RC resistors R1, R2, and R3 and MOS capacitors 706, 710, and 718 to set the delay requirements. First two RC stages have longer delay. The last stage RC (716, 718), AND gate (720, 722) adds a shorter delay only for low to high transition. Note the delays can be set to any required pulse width for disabling the decoders when a transition occurs at address/select lines. Also note the break delay can be set to equal delay for both low to high and high to low transitions if desired so. In FIG. 7 for example if NAND gate (720) is replaced by an inverter the BB4M pulse width (delay) will be equal for both low and high transitions. Another example if a shorter BB4M pulse is required for low to high transition the NAND gate (720) can be replaced with NOR gate.

Power and substrate connections VDD, GND, and WSUB are also shown in FIGS. 7A-7B.

A delayed signal of each input select is generated through delay blocks (104A, 104B, 104C) in FIG. 2 (SEL_DEL_1 to SEL_DEL_N) when a transitions occurs from low to high or from high to low at address/select digital inputs. These are delayed signals for address/select inputs keeping the same polarity as inputs. Delayed signals in select delays are shorter delays in comparison to break delay. These select delays are intended to prevent decoding before the falling edge of the single shot pulse of BB4M is enabled.

Break delay, inverter and exclusive OR (XOR) digital gates generate break pulse for each input select signals labeled BREAK_PULSE_1 to BREAK_PULSE_N in FIG. 2. These break pulses are generated for each input select signal when a transition from address/select inputs logic voltage level high to logic voltage level low or vice versa from logic voltage level low to logic voltage level high occurs on input select signal.

Inputs to each XOR digital gate are the inverted input select signal SEL_B_N and the delayed input select signal VIN_DEL_N. The time delay of break-delay blocks producing VIN_DEL_1 to VIN_DEL_N signal are much longer than the delay of the digital inverters producing SEL_B_1 to SEL_B_N signals. Output of XOR logic gate BREAK_PULSE_1 to BREAK_PULSE_N signals remain at high logic level when there is no transition on its input select signal.

When an input select signal transitions from low to high, or transitions from high to low logic level, output of XOR transitions from high to low logic level after an inverter delay time. Output of XOR remains low for the period of the delay time set in break-delay circuit. At the completion of the delay time (set by break-delay) the output of XOR transitions from low to high logic level. Thus output of XOR digital gate produces break-pulse (high low high) shape when there is a transition at input select signal.

Individual generated break pulses BREAK_PULSE_1 to BREAK_PULSE_N for each input select are logically ANDED to produce a single global break before make pulse signal BB4M_EN_PULSE. This pulse is combined logically or ANDED with controlled or enabled signals. Final single global pulse BB4M-EN_PULSE at the output of break-before-make circuit and the delayed input signals SEL_DEL_1 to SEL_DEL_N are fed into the input of decoder circuits for fmal decoding and selection of appropriate channel in multiplexer.

When an input select makes a transition, the output of the break-before-make circuit, BB4M pulse transitions from high to low and break all the decoders (including the previously selected channel). For the entire period of break-before-make time (BB4M_EN_PULSE remaining at low logic level) all decoders are disabled. After the break-before-time pulse width BB4M_EN_PULSE transitions from low logic voltage level to high logic voltage level. This enables decoders for the new input select signals to be decoded to select a new channel.

Delayed input signals SEL_DEL_1 to SEL_DEL_N are delayed intentionally to be slower than the falling edge of the BB4M pulse at beginning of the break-before-make when input select transition occurs. Longer delay of input signals compare to falling edge of the BB4M_EN_PULSE ensures that the before-break-make signal, BB4M_EN_PULSE disables all the decoders to prevent glitches and transients. The delay of input selects in select delay blocks is set based on worst case timing skew among input select signals. This delay must also be shorter than the delay through break-delay blocks for break-before-make circuits to be effective.

Figure 8:
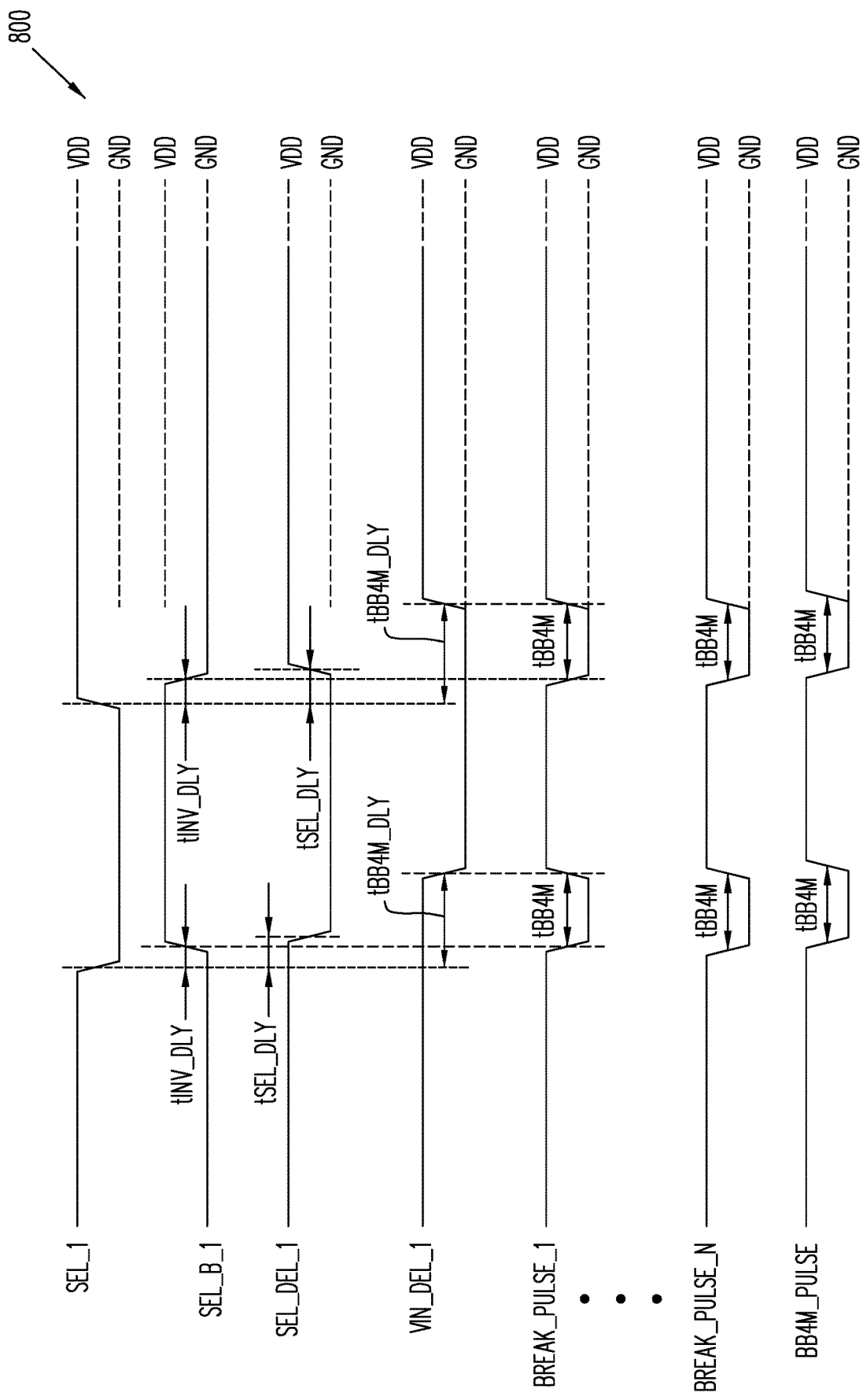
FIG. 8 shows a timing diagram of selected signals in the break-before-make circuit according to the present invention.

Global signal BB4M_EN_PULSE and delayed input select signals SEL_DEL_1 to SEL_DEL_N are fed to input of decoders. Select delay block similar to break delay blocks use RC elements (low pass filters) which are more tolerant to radiation effects and help to attenuate radiation induced voltage glitches. Timing sequence and pulse generation of BB4M circuit with input select lines transition is shown in timing diagram 800 in FIG. 8. It is important to note in FIG. 8 that when an address/select line makes a transition high to low or low to high individual break pulse (BREAK_PULSE_1) signal and global BB4M signal (BB4M_PULSE) always transition from high to low. This sets the beginning of break before make pulse (BB4M). The delay time from address transition to beginning of BB4M pulse is relatively short (delay through inverter and XOR gates). BB4M pulse width is determined by a longer delay in break delay block. Also shown in FIG. 8 are the SEL_1, SEL_B_1, SEL_DEL_1, VIN_DEL_1, BREAK_PULSE_1 through BREAK_PULSE_N, and BB4M_PULSE signals. Pulse widths and other time measurements include tINV_DLY, tSEL_DLY, tBB4M_DLY, and tBB4M.

Figure 9:
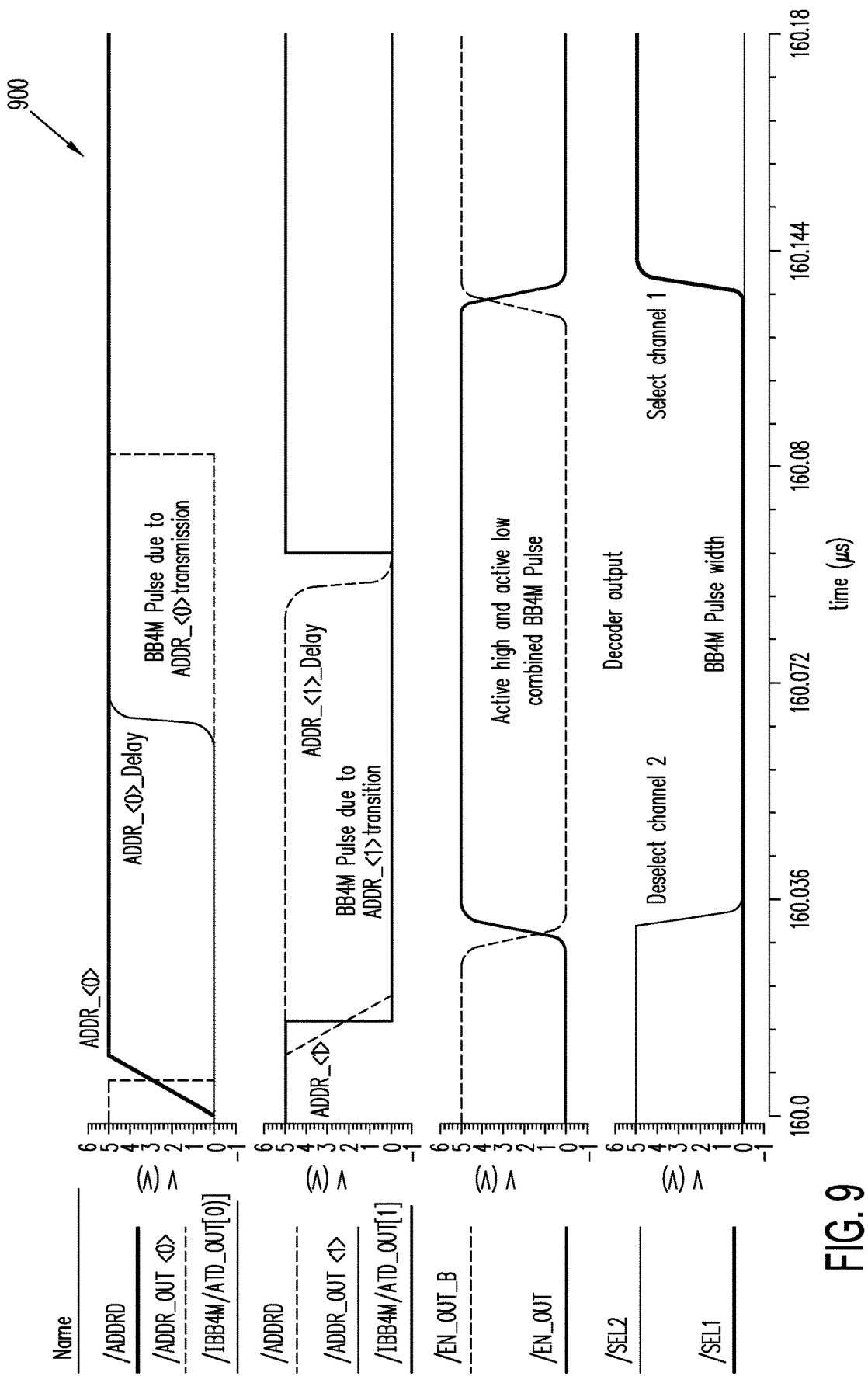
FIG. 9 shows a timing diagram of a break-before-make simulation from input address to the input of a multiplexer switch according to the present invention.

FIG. 9 shows a timing diagram 900 of the simulated timing sequence and pulse generation of BB4M circuit with seven address/input select lines transition. X1_ATD_OUT is the global BB4M_EN_PULSE signal. It is important to note in FIG. 9 that even with two address/select (ADDR<0> and ADDR<1>) input transition times being skewed; glitch free break before make single shot pulse is generated for each address/select inputs. Furthermore, global break before make pulse (BB4M) that combines individual BB4M pulses has no glitches. Depicted in FIG. 9 are the ADDRD, ADDR_OUT <0>, BB4M, ATD_OUT[0], ADDR_OUT<1>, ATD_OUT[1], EN_OUT_B, EN_OUT, SEL2, and SEL1 signals according to the present invention.

The Break-Before-Make circuit according to the present invention, by utilizing RC delay circuits instead of storage device elements such as latches, flip flops or any type of cross coupled feedback circuits, improves the immunity to SEU in radiation environment.

Figure 10:
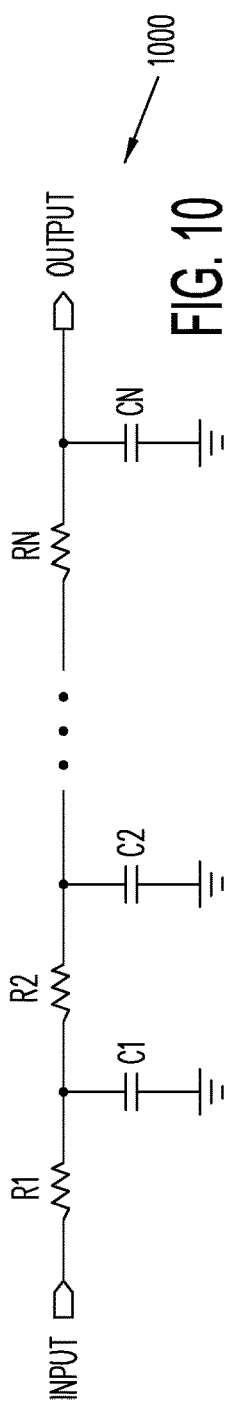
FIG. 10 shows a schematic diagram of fixed RC delay circuit suitable for use with the BB4M pulse generation according to the present invention.

A fixed RC delay circuit required to set the Break-Before-Make pulse width is shown in FIG. 10. Circuit 1000 includes N serially-coupled resistors R1, R2, through RN, and capacitors C1, C2, through CN coupled to the intermediate resistor nodes. The delay from the INPUT to the OUTPUT can be defined as function of R, C and N and the trip point (VOUT) of the next stage that the RC circuit is fed to. For a single RC stage, VOUT voltage as function of time with digital input (step input) is shown below:

$$VOUT(t) = VIN(t)\left(1 - e^{\left(\frac{-t}{RC}\right)}\right)$$

Rearranging the above equation and solving for the time (Tdelay), the following equation is the delay due to N stages of RC.

$$Tdelay = -(N*RC)*\text{Ln}\left(1 - \frac{VOUT}{VIN}\right)$$

It is important to note that in the above equation VOUT/VIN is always less than unity. Typically the trip point is set based on circuit/delay requirements. For digital gates trip point is normally set to 50% of the power supply (VDD).

Figure 11:
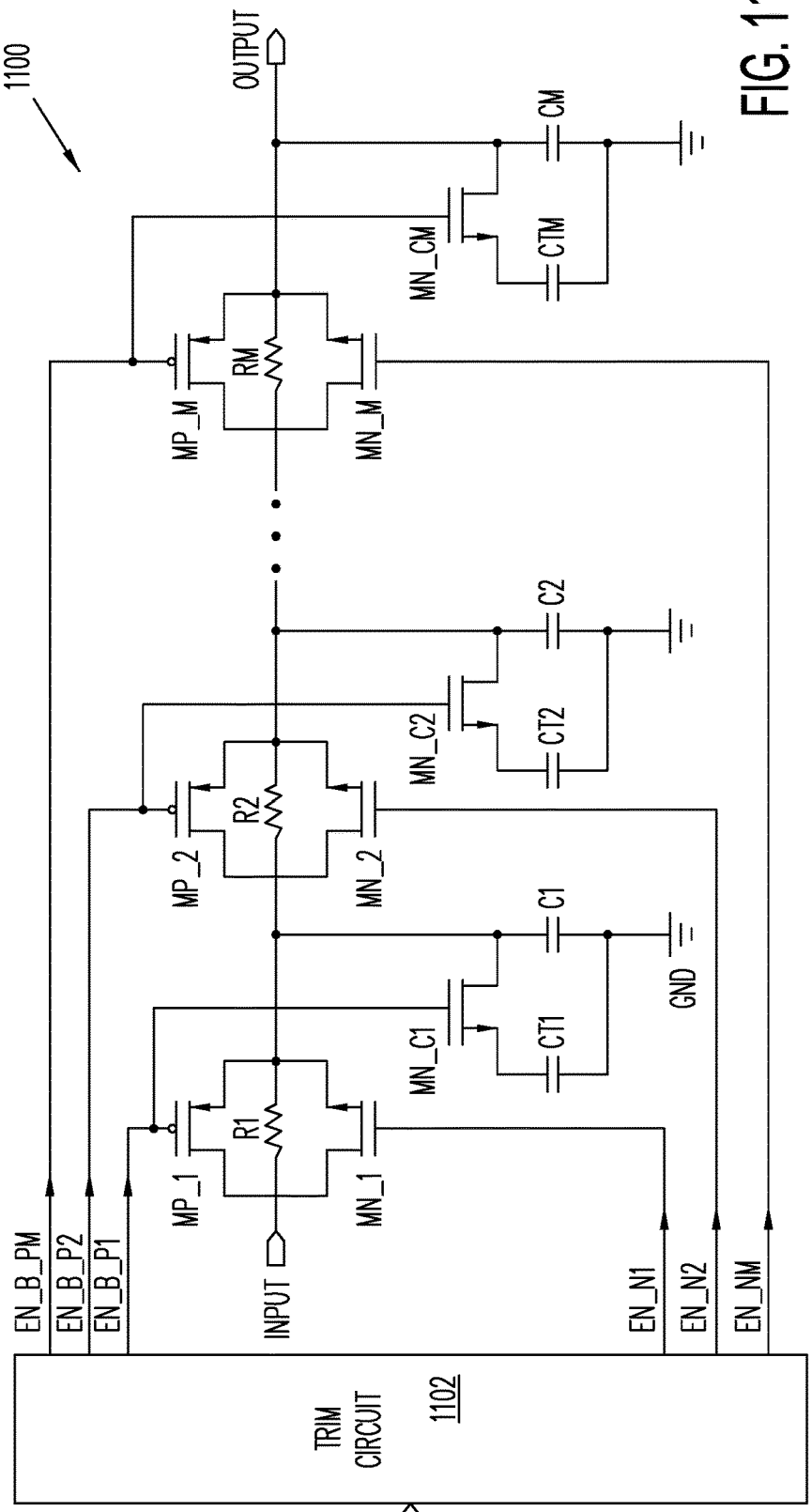
FIG. 11 shows a schematic diagram of a programmable RC delay for suitable for use with the BB4M circuit according to the present invention.

An RC delay circuit 1100 schematic in FIG. 11 is a programmable delay to adjust (decrease or increase) the BB4M pulse width. A trimming circuit 1102 and switches adjust the delay thus allowing BB4M pulse width to vary depending on the application frequency and timing requirements. Switch MP_1, MN_1 selectively couples in resistor R1, switch MP_2, MN_2 selectively couples in resistor R2, and switch MP_M, MN_M couples in resistor RM. Switch MN_C1 selectively couples capacitor CT1 to capacitor C1, switch MN_C2 selectively couples capacitor CT2 to capacitor CT2, and switch MN_CM couples capacitor CTM to capacitor CM.

The duration of the BB4M pulse can be a fixed delay or programmable as shown in the circuits of FIGS. 10-11.

The RC delay schematic of FIG. 11 is a programmable delay circuit to adjust (decrease or increase) the BB4M pulse width. A trimming circuit and corresponding switches adjust the delay through the resistor and capacitor elements, thus allowing the BB4M pulse width to be programmable depending on the application frequency and timing requirements.

In FIG. 11, there are M numbers of transmission gates that can be programmed to adjust the required delay. Each transmission gate can be comprised of NMOSFET and PMOSFET elements, which function as an electronic switch. True and complementary signals (EN_N1 to EN_NM and EN_B_PM1 to EN_BPMM) to the gate of the NMOSFET and PMOSFET program each transmission gate/switch independent to be configured as an open or closed switch.

When the switch including MP_1 and MN_1 is open (both the NMOSFET and PMOSFET are turned off) the effective resistor value is R1 and the effective capacitor value at the output of the transmission gate is CT1+C1. When this same switch is closed (both NMOSFET MN_1 and PMOSFET MP_1 are turned on) the effective resistor value is the parallel resistance of the NMOSFET and PMOSFET "on" resistances. The effective capacitance value is C1. C1 is the total parasitic capacitance at the output of the transmission gate. R1 and CT1 are the intentional resistance and capacitance added for setting the delay.

Figure 12:
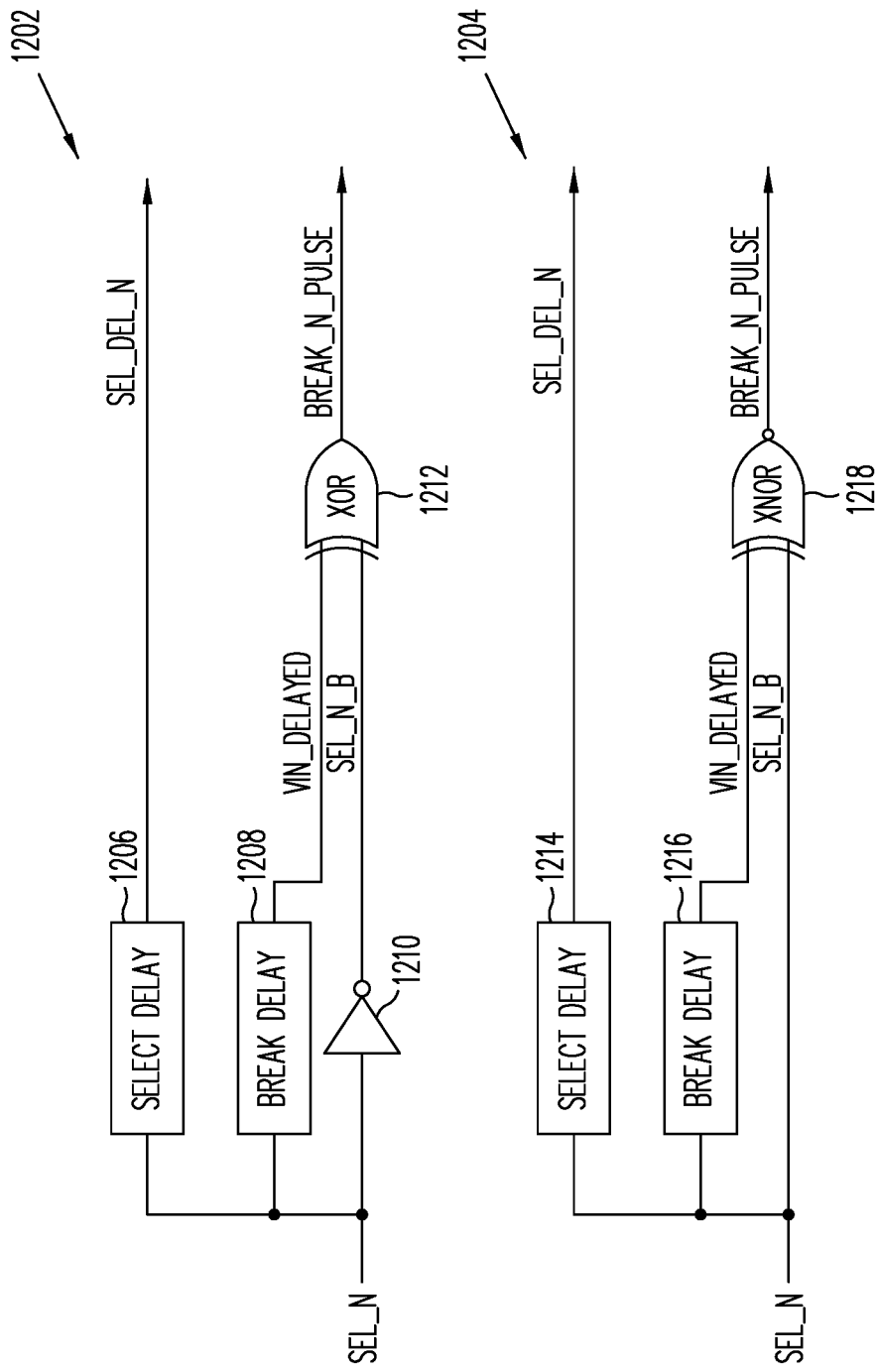
FIG. 12 shows two schematic diagrams for break-before-make pulse generation circuits according to the present invention.

Two methods to generate break-before-make pulse generation are shown in FIG. 12. The number of gates and or buffers can be increased if desired depending on timing requirements. In circuit 1202 a select delay circuit 1206, a break delay circuit 1208, an inverter 1210, and an XOR gate 1212 is shown. As before, the input signal is the SEL_N signal, and the output signals are the SEL_DEL_N and BREAK_N_PULSE signals. Alternatively, in circuit 1204 a select delay circuit 1214, a break delay circuit 1216, and a XNOR gate 1218 is shown. As before, the input signal is the SEL_N signal, and the output signals are the SEL_DEL_N and BREAK N PULSE signals.

There are some circuit techniques that would minimize the single event upset in break-before-make utilizing cross coupled devices latches, flip flops, memory elements. However they often increase circuit complexity and increase layout and die size area. Proposed break-before-make circuit in this patent application shown in FIGS. 5-7 utilizes RC delay (fixed or programmable/adjustable) elements and combinatorial logic with edge detection circuit. This completely eliminates use of any cross-coupled circuits which are prone to single event upset.

Figure 13:
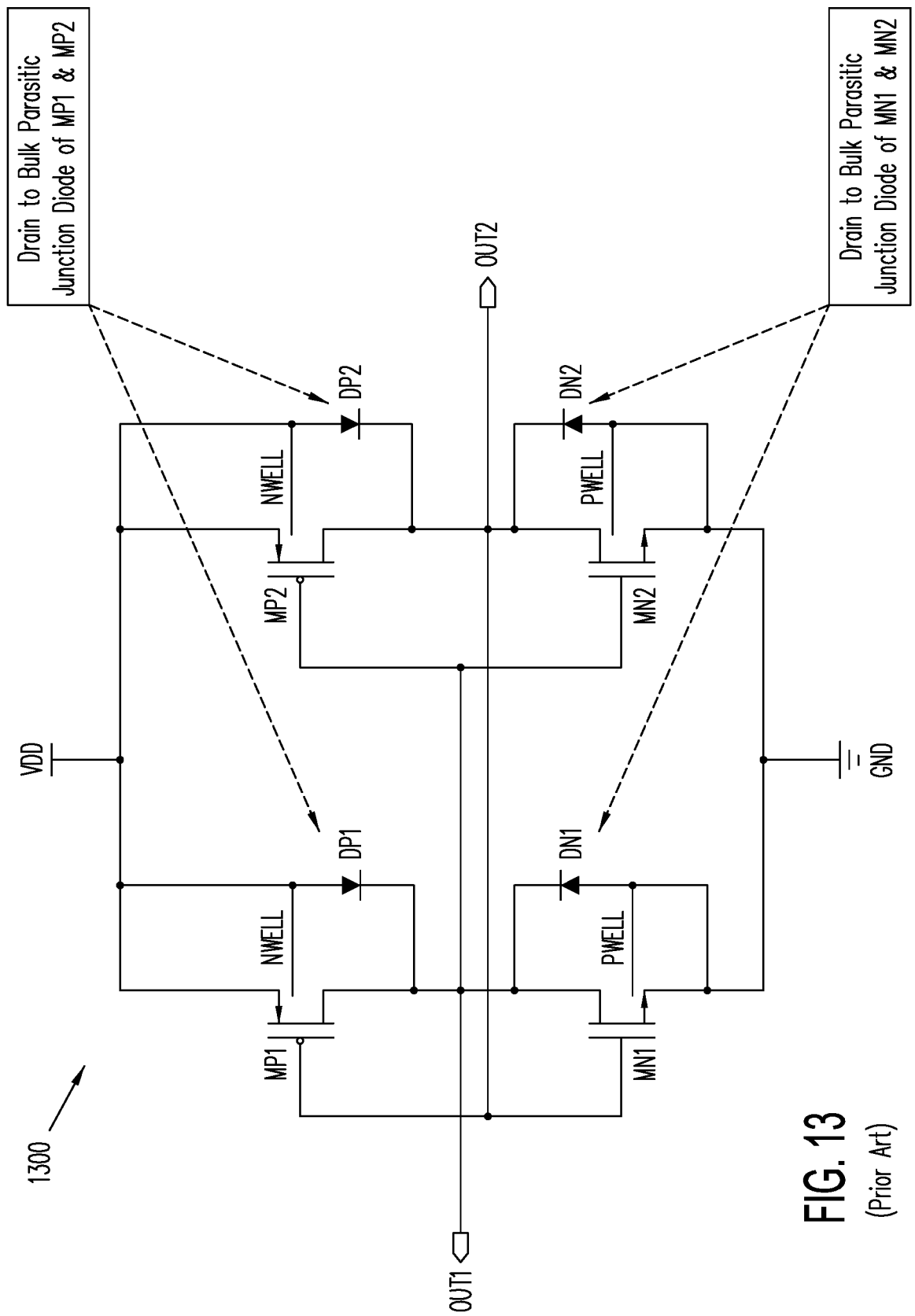
FIG. 13 shows a cross-coupled inverter latch schematic as is known in the art.

A schematic diagram of a simple cross-coupled inverter 1300 is shown in FIG. 13. For example, OUT1 and OUT2 nodes in SRAM memory cells are connected to bit lines for read and write operation to the memory cell through switches. The SEU sensitivity of this latch circuit to radiation environment is described below.

In the steady state OUT1=VDD (logic high level) and OUT2=GND (logic low level). In this state MP1 PMOS and MN2 NMOS are on while MP2 PMOS and MN1 NMOS are turned off. A radiation induced voltage glitch, (high to low) with sufficient amplitude at drain of off NMOS (MN1) can change the data polarity of OUT2 to VDD level by turning on the MP2 PMOS and MN1 NMOS due to cross coupled connection from output of each inverter to the input of other inverter.

In a similar way when OUT1=GND and OUT2=VDD. In this state MP2 PMOS and MN1 NMOS are on, while MP1 PMOS and MN2 NMOS are off. A radiation induced voltage glitch (low to high) with sufficient amplitude on drain of MP1 PMOS (which is off) can reverse the polarity on OUT2 and OUT1.

A radiation induced voltage glitch at input of synchronous flip flops with sufficient amplitude and duration can be captured. BREAK-BEFORE-MAKE circuit proposed in this document is a radiation-hardened circuit that is immune to glitches/transients and single event effects.

In summary, a Break-Before-Make circuit according to the present invention is radiation tolerant to single event upset effects by design since no latch, flip-flop, or other storage device or cross-coupled structures are used. A blanking/disabling time pulse (break pulse) is generated using resistor and capacitors and combinatorial logic gates which are more immune to radiation effects such as single event upset in comparison to delays generated from combinatorial logics such as inverter gates/buffers. The Break-Before-Make pulse width/timing can be decreased or increased by programming or adjusting RC delay elements (resistance and capacitance) values in Break-Before-Make circuit through switches. These switches can be controlled by register bits or connected to VDD supply and ground. The RC delay circuits in the BB4M circuit is a low pass filter that attenuates the radiation induced voltage glitches on front end circuits such as input protection pads of select lines. Timing requirements and accuracy of Break-Before-Make circuit are better controlled by using RC delay elements. Timing skews between the digital select inputs used for decoding in multiplexers can be accommodated without causing functionality errors. Using resistor and capacitor as delay elements improves layout/die area efficiency of integrated circuits by eliminating redundant and extra SEU mitigation circuits. Capacitors in delay circuits can be designed with passive capacitors or active MOS devices. In RC delay circuits, the positive temperature coefficient of capacitors can be compensated with negative temperature coefficient of poly resistors to make the BB4M generated pulse width more flat with temperature.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A radiation hardened circuit, comprising:
   an input for receiving an input signal;
   a first delay circuit for generating a first delayed input signal having a first delay with respect to the input signal;
   a second delay circuit for generating a second delayed input signal having a second delay with respect to the input signal; and
   an exclusive-nor logic circuit with a first input, a second input, and an output, wherein the first input is coupled to the input signal and the second input is coupled to the second delayed input signal, and the exclusive-nor logic circuit is configured to generate a break-before-make pulse having a pulse width in response to a transition of the input signal;
   a second output coupled to the output of the exclusive-nor logic circuit; and
   a decoder circuit coupled to the first delay circuit and the exclusive-nor logic circuit, the decoder circuit is configured to enable one of a plurality of channel select signals according to the first delayed input signal and the break-before-make pulse, wherein the second delay is greater than the first delay, and the first delayed input signal transitions during the pulse width of the break-before-make pulse.

2. The radiation hardened circuit of claim 1, wherein the input is coupled to an address select line.

3. The radiation hardened circuit of claim 2, further comprising a first output coupled to the first delayed input signal, wherein the first output is coupled to a delayed address select line having the first delay with respect to the input signal.

4. The radiation hardened circuit of claim 3, wherein the second output is coupled to a break-before-make pulse line.

5. The radiation hardened circuit of claim 1, wherein the first delay circuit comprises:
   one or more series resistive circuit elements,
   one or more shunt capacitive circuit elements, and
   a buffer circuit.

6. The radiation hardened circuit of claim 5, wherein the buffer circuit comprises one or more inverter logic gates.

7. The radiation hardened circuit of claim 1, wherein the second delay circuit comprises:
   one or more series resistive circuit elements,
   one or more shunt capacitive circuit elements, and
   one or more buffer circuits.

8. The radiation hardened circuit of claim 7, wherein the second delay circuit further comprises a trimming circuit configured to adjust a value of at least one of the one or more series resistive circuit elements.

9. The radiation hardened circuit of claim 8, wherein the trimming circuit comprises switches configured to selectively bypass the at least one of the one or more series resistive circuit elements.

10. The radiation hardened circuit of claim 7, wherein the second delay circuit further comprises a trimming circuit configured to adjust a value of at least one of the one or more shunt capacitive circuit elements.

11. The radiation hardened circuit of claim 10, wherein the trimming circuit comprises switches to selectively decouple the at least one of the one or more shunt capacitive circuit elements.

12. The radiation hardened circuit of claim 1, wherein the second delay circuit is further configured to introduce a longer delay for a rising edge transition on the input signal than for a falling edge transition on the input signal.

13. The radiation hardened circuit of claim 1, wherein the second delay circuit is further configured to introduce a longer delay for a falling edge transition on the input signal than for a rising edge transition on the input signal.

14. The radiation hardened circuit of claim 1, wherein the output of the exclusive-nor logic circuit is coupled to an input of a buffer circuit; and the second output is coupled to an output of the buffer circuit.

15. The radiation hardened circuit of claim 1, wherein neither of the first delay circuit or the second delay circuit contains any of a latch, a flip-flop, and a cross-coupled circuit structure.

16. The radiation hardened circuit of claim 1, wherein the first delay circuit and the second delay circuit are generated with resistor-capacitor circuits.

17. The radiation hardened circuit of claim 1, wherein the decoder circuit is configured to enable one of a plurality of channel select signals with a decoding delay defined at least partially by the pulse width of the break-before-make pulse.

18. The radiation hardened circuit of claim 1, wherein the pulse width of the break-before-make pulse is at least partially defined by the second delay of the second delayed input signal.

* * * * *